(12) United States Patent
Prushinskiy et al.

(10) Patent No.: US 9,372,395 B2
(45) Date of Patent: Jun. 21, 2016

(54) METHOD OF MANUFACTURING A MASK

(71) Applicant: Samsung Display Co., Ltd., Yongin, Gyeonggi-Do (KR)

(72) Inventors: Valeriy Prushinskiy, Hwaseong-Si (KR); Minsoo Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 245 days.

(21) Appl. No.: 14/260,661

(22) Filed: Apr. 24, 2014

(65) Prior Publication Data

US 2014/0356769 A1  Dec. 4, 2014

(30) Foreign Application Priority Data

May 30, 2013 (KR) ........................ 10-2013-0061823

(51) Int. Cl.
*G03F 1/80* (2012.01)
*G03F 7/00* (2006.01)

(52) U.S. Cl.
CPC ................ *G03F 1/80* (2013.01); *G03F 7/0015* (2013.01)

(58) Field of Classification Search
CPC ............... G02F 1/80; G02F 1/16; G02F 1/50; G02F 7/0015; C23C 14/24; C23C 14/26; C23C 14/04; C23C 14/042
USPC ........................................ 430/5, 320; 216/12
See application file for complete search history.

(56) References Cited

U.S. PATENT DOCUMENTS

| 2010/0192856 | A1 | 8/2010 | Sung et al. | |
| 2011/0027461 | A1* | 2/2011 | Matsudate | C23C 14/042 427/67 |
| 2013/0071775 | A1* | 3/2013 | Prushinskiy | G03F 1/76 430/5 |

FOREIGN PATENT DOCUMENTS

| JP | 2011-054290 A | | 3/2011 |
| KR | 2007-0002553 A | * | 1/2007 |
| KR | 10-2010-0090070 A | | 8/2010 |

OTHER PUBLICATIONS

Computer-generated translation of KR 2007-0002553 (Jan. 2007).*

* cited by examiner

*Primary Examiner* — John A McPherson
(74) *Attorney, Agent, or Firm* — Lee & Morse, P.C.

(57) ABSTRACT

A method of manufacturing a mask, the method including forming initial ribs such that forming the initial ribs includes forming at least two photoresist patterns such that the at least two photoresist patterns have different widths, are formed on at least one side of a mask substrate, and overlap each other, and performing an etching process at least two times; and forming final ribs such that the final ribs have curved sides having a different curvature radius than a curvature radius of initial curved sides of the initial ribs and have defined slit patterns, forming the final ribs including removing all but one of the at least two photoresist patterns, and performing an etching process.

17 Claims, 9 Drawing Sheets

METHOD OF MANUFACTURING A MASK

CROSS-REFERENCE TO RELATED APPLICATION

Korean Patent Application No. 10-2013-0061823, filed on May 30, 2013, in the Korean Intellectual Property Office, and entitled: "Method of Manufacturing Mask," is incorporated by reference herein in its entirety.

BACKGROUND

1. Field

Embodiments relate to a method manufacturing a mask.

2. Description of the Related Art

A flat panel display or a semiconductor device may be manufactured by deposition various kinds of materials in a thin film form. A pattern of a thin film may be directly formed on a substrate by using a deposition mask or may be formed by transferring a pattern of a photo mask on a deposition thin film of a substrate.

SUMMARY

Embodiments are directed to a method manufacturing a mask.

The embodiments may be realized by providing a method of manufacturing a mask, the method including forming initial ribs such that forming the initial ribs includes forming at least two photoresist patterns such that the at least two photoresist patterns have different widths, are formed on at least one side of a mask substrate, and overlap each other, and performing an etching process at least two times; and forming final ribs such that the final ribs have curved sides having a different curvature radius than a curvature radius of initial curved sides of the initial ribs and have defined slit patterns, forming the final ribs including removing all but one of the at least two photoresist patterns, and performing an etching process.

Forming the initial ribs and forming the final ribs may each include performing a photolithography process.

Forming the initial ribs may include forming a first photoresist pattern at a top of the mask substrate such that the first photoresist pattern has a width corresponding to a top width of the final ribs, forming a second photoresist pattern at a bottom of the mask substrate such that the second photoresist pattern has a width corresponding to a bottom width of the final ribs and faces the first photoresist pattern with the mask substrate therebetween, forming a third photoresist pattern on the second photoresist pattern such that the third photoresist pattern has a larger width than the second photoresist pattern and completely covers the second photoresist pattern, forming a first etching part at a top of the mask substrate by using the first photoresist pattern as a protective layer, forming a second etching part at a bottom of the mask substrate by using the second and third photoresist patterns as a protective layer, forming a fourth photoresist pattern on the first photoresist pattern and the first etching part; and forming the initial curved sides by through etching an area of the mask substrate between the first etching part and the second etching part using the first to fourth photoresist patterns as a protective layer.

The initial curved sides may have a smaller curvature radius than that of the curved sides.

The third photoresist pattern may have a width larger than a bottom width of the final ribs.

A bottom of the initial ribs may have a larger width than a bottom of the final ribs.

An etching depth of the second etching part may be less than a height of the curved sides of the final ribs.

Forming the final ribs may include exposing side ends of a bottom of the initial ribs by removing the third photoresist pattern; and etching the side ends of the bottom of the initial ribs by using the first photoresist pattern, the second photoresist pattern, and the fourth photoresist pattern as a protective layer.

Forming the initial ribs may include forming a first photoresist pattern at a top of the mask substrate such that the first photoresist pattern has a width corresponding to a top width of the final ribs, forming a second photoresist pattern at a bottom of the mask substrate such that the second photoresist pattern has a width corresponding to a bottom width of the final ribs and facing the first photoresist pattern with the mask substrate therebetween, forming a third photoresist pattern on the first photoresist pattern such that the third photoresist pattern has a larger width than the first photoresist pattern to completely cover the first photoresist pattern, forming a first etching part at a top of the mask substrate by using the first photoresist pattern and the third photoresist pattern as a protective layer, forming a second etching part at a bottom of the mask substrate by using the second photoresist pattern as a protective layer; forming a fourth photoresist pattern on the third photoresist pattern and the first etching part; and forming the initial curved sides by through etching an area of the mask substrate between the first etching part and the second etching part using the first to fourth photoresist patterns as a protective layer.

The initial curved sides may have a smaller curvature radius than that of the curved sides.

The third photoresist pattern may have a width larger than a top width of the final ribs.

The top width of the final ribs is less than a top width of the initial ribs.

An etching depth of the second etching part may be less than a height of the curved sides of the final ribs.

Forming the final ribs may include exposing side ends of a top of the initial ribs by removing the third photoresist pattern and the fourth photoresist pattern; and etching the side ends of the top of the ribs by using the first photoresist pattern and the second photoresist pattern as a protective layer.

The etching process may include an isotropic etching process using wet etching.

Each of the final ribs defining the slit pattern may have a top width that is larger than a bottom width thereof and has a symmetrical trapezoidal cross-section; and a side of the cross-section may have a linear side vertically extending in a downward direction from an end part of the top, and the curved side concavely extending from an end part of the linear side to an end part of the bottom.

The mask may be a deposition mask for a deposition process of a flat panel display or semiconductor device, or a photo mask used for a photolithography process of a flat panel display or semiconductor device.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
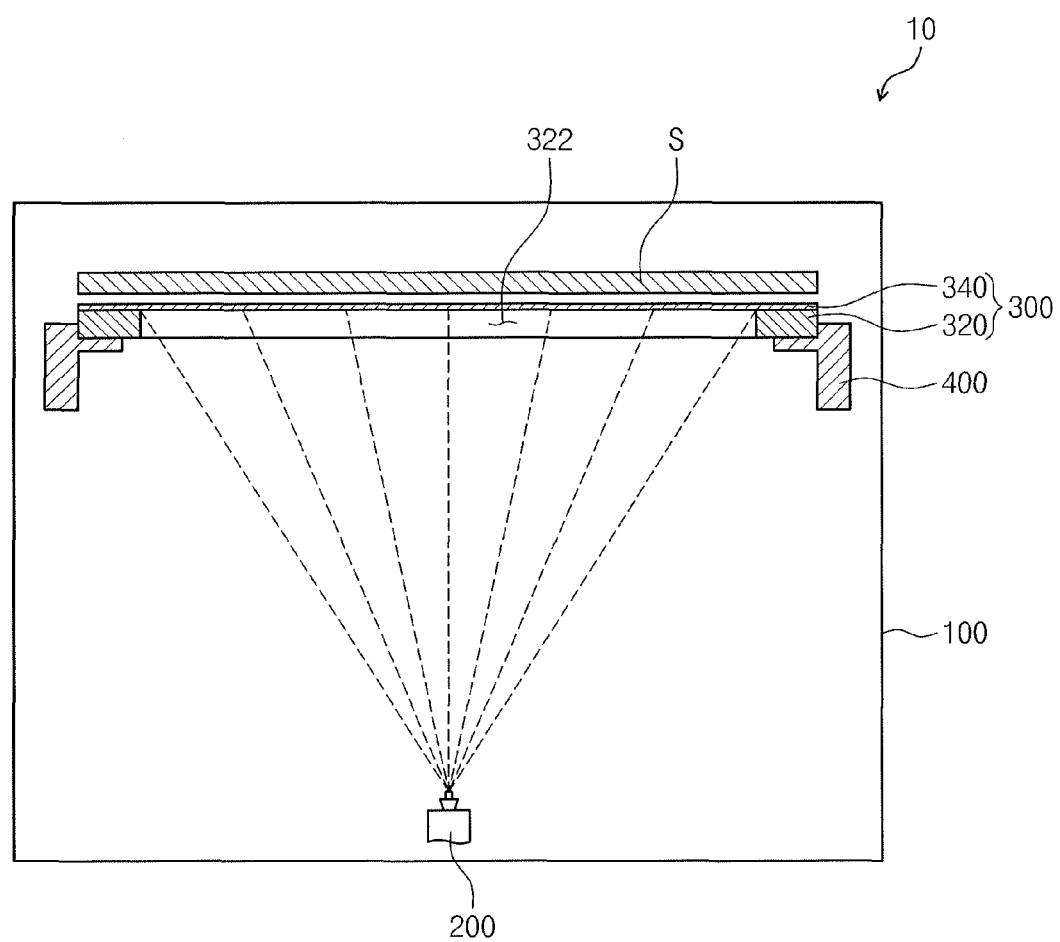
FIG. 1 illustrates a sectional view of a flat panel display deposition device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

According to an embodiment, a deposition mask used for a deposition device of, e.g., a flat panel display (FPD), may be exemplarily used as a mask. A mask manufacturing method according to an embodiment may be applied to manufacturing various kinds of masks, e.g., a deposition mask used for a deposition process of a semiconductor device or a photo mask used for a photolithography process of an FPD or a semiconductor device.

For example, the deposition mask may be a mask used for a deposition process of electrodes (cathode/anode) and/or an organic light emitting layer in an organic EL display device, or may be a mask used for a deposition process for forming a pattern on a semiconductor wafer through a thermal deposition/e-beam deposition method.

The photo mask may be a mask used for pattern transfer of an exposure process among processes for forming a thin film transistor or a pixel electrode of a liquid crystal display device, or may be a mask used for pattern transfer of an exposure process among processes for manufacturing a semiconductor device.

FIG. 1 illustrates a sectional view of an FPD deposition device 10. Referring to FIG. 1, the FPD deposition device 10 may include a chamber 100, a deposition source 200, a mask assembly 300, and a fixing member 400.

The chamber 100 may provide a space where a deposition process is performed. For example, the deposition process may be a process in which an organic material is supplied to a deposition surface of a substrate S to deposit an organic light emitting layer. A vacuum pump (not shown) for maintaining a vacuum state in the chamber 100 during a process may be connected to the chamber 100.

The deposition source 200 may be disposed at an inner lower part of the chamber 100, and an organic material may be supplied to a deposition surface of the substrate S on an inner upper part of the chamber 100. The mask assembly 300 may include a mask frame 320 and a mask 340 and may be disposed on an inner upper part of the chamber 100 to face the deposition source 200. The substrate S may be provided on the mask assembly 300. The substrate S may be spaced a predetermined distance (in an upper direction from the top end of the mask assembly 300) apart from a top end of the mask assembly 300, and may overlap an entire open area of an opening part 322 of the mask frame 320. The organic material that the deposition source 200 provides may be deposited on the deposition surface, e.g., the bottom, of the substrate S through the opening part 322 of the mask frame 320 and a slit pattern (not shown) of the mask 340. A layer of the organic material deposited on the substrate S may have a pattern corresponding to the slit pattern (not shown) of the mask 340. The fixing member 400 may be disposed outside of a moving path of the organic material supplied from the deposition source 200 to the substrate S, and may support an edge part of the mask assembly 300.

Figure 2:
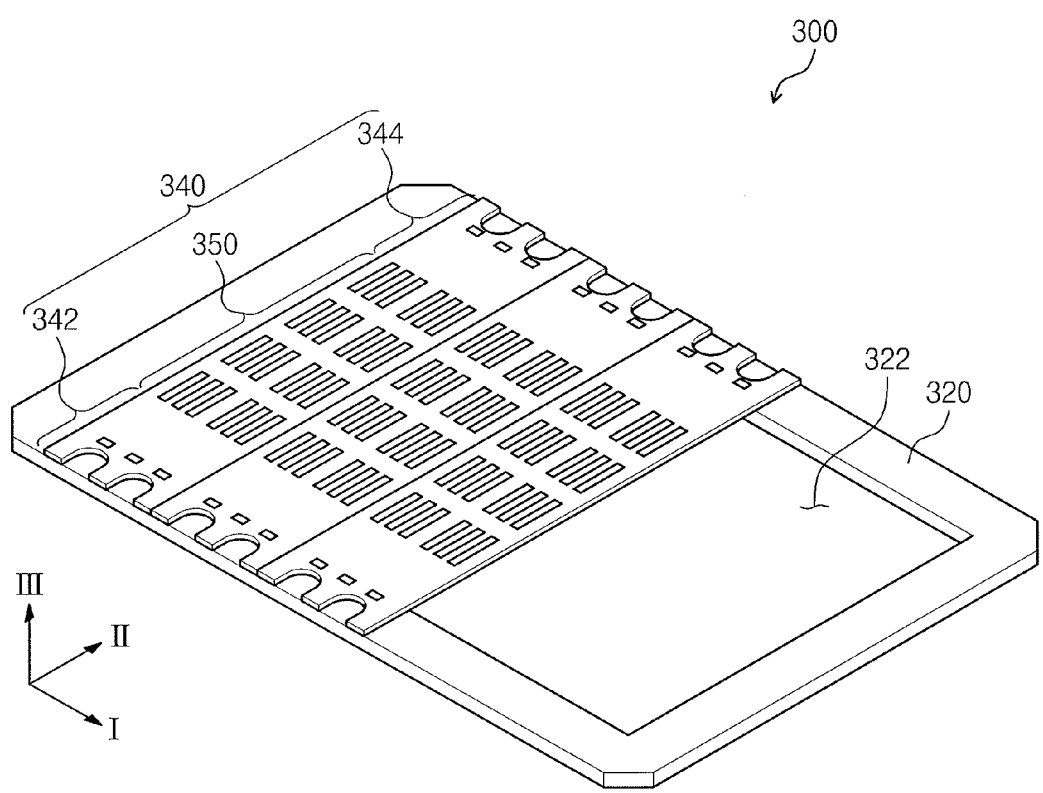
FIG. 2 illustrates an enlarged perspective view of a mask assembly of FIG. 1.

FIG. 2 illustrates an enlarged perspective view of the mask assembly 300 of FIG. 1. Referring to FIG. 2, the mask assembly 300 may include the mask frame 320 and the plurality of masks 340.

The mask frame 320 may have a rectangular shape and may include the opening part 322 at an interior thereof. The plurality of masks 340 may be fixed to the mask frame 320 by, e.g., welding. The mask frame 320 may be formed of a material that is less susceptible to deformation by external force, e.g., a metallic material having high rigidity. The opening part 322 may have an opening area of a sufficient size to cover a display area of the substrate S of FIG. 1, e.g., a deposition target. For example, the opening part 322 may have a rectangular shape.

Here, a long side direction of the mask frame 320 may be defined as a first direction I, a short side direction of the mask frame 320 may be defined as a second direction II, and a thickness direction of the mask frame 320 may be defined as a third direction III.

Each of the masks 340 may be provided as a rectangular plate extending lengthwise in the second direction II. The masks 340 may be a fine metal mask formed of a metal thin film. In an implementation, the masks 340 may be formed of, e.g., one material of Steel Use Stainless (SUS), Invar, nickel, cobalt, or alloys thereof. On the basis of a length direction of the masks 340, i.e., the second direction, a pattern part 350 may be formed in a central area of each mask 340, and welding parts 342 and 344 may be formed in peripheral areas at sides of the central area. The plurality of masks 340 may be arranged in a row close to or adjacent to each other along the first direction I, on the mask frame 320, and may cover the top end of the opening part 322 of the mask frame 320. The welding parts 342 and 344 of the plurality of masks 340 may be welded to the edge area of the long side of the mask frame 320.

Figure 3:
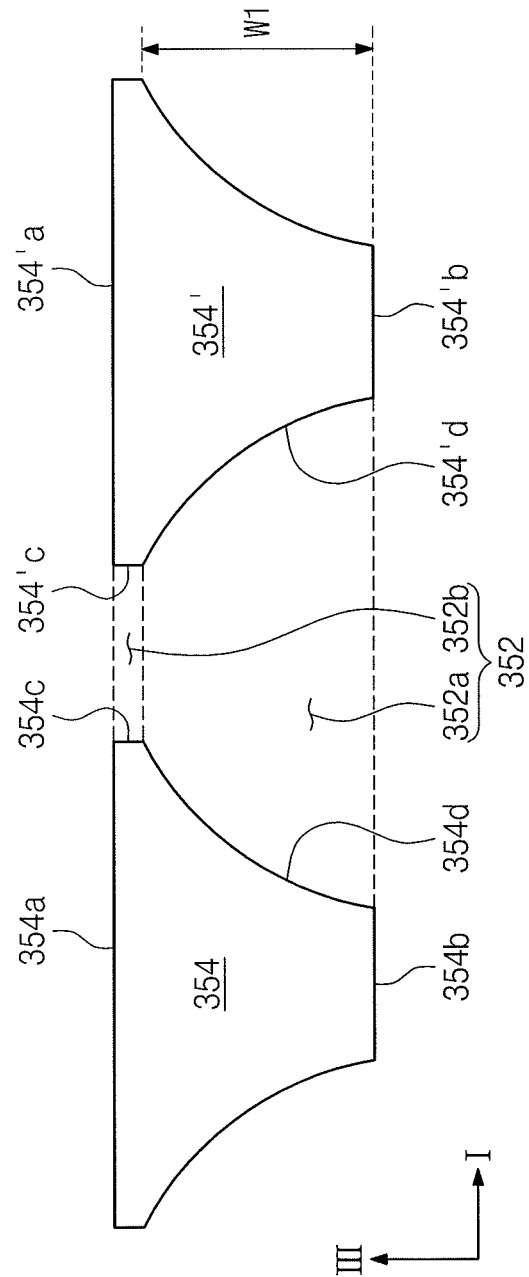
FIG. 3 illustrates a sectional view of an enlarged portion of a pattern part of FIG. 2.

FIG. 3 illustrates a cross-sectional view of an enlarged portion of the pattern part 350 of FIG. 2.

Referring to FIGS. 2 and 3, the pattern part 350 of each mask 340 may include a plurality of slits 352 and a plurality of final ribs 354 and 354' defining the slits 352. For example, the plurality of slits 352 and plurality of final ribs 354 and 354' defining the slits 352 may be repeatedly, regularly, and/or alternately arranged. A sectional form or shape of each slit 352 may be defined by the forms or shapes of the two final ribs 354 and 354' at the left and right sides thereof. The form or shape of each of the final ribs 354 and 354' may be the same, and a form or shape of any one final rib 354 is described as one example.

The final rib 354 may have a top 354a having a width that is greater than that of a bottom 354b thereof, and may have a roughly symmetrical trapezoidal sectional shape. Sides of the final rib 354 may include a linear side 354c (that vertically extends in a downward direction from an end of the top 354a) and a curved side 354d (that concavely extends (e.g., in an upward direction) from an end of the linear side 354c to an end of the bottom 354b).

The slits 352 may include inlet parts 352a (defined by the curved sides 354d and 354'd of the final ribs 354 and 354') and outlet parts 352a (defined by the linear sides 354c and 354'c of the final ribs 354 and 354'). The organic material (e.g., that the deposition source 200 of FIG. 1 supplies) may pass through the opening part 322 of the mask frame 320, and then may flow into the inlet parts 352a. The organic material flowing into the inlet parts 352a may be deposited on the deposition surface of the substrate S of FIG. 1 via the outlet parts 352b.

In order meet a high resolution FPD, the mask 340 of a fine pattern may be used for depositing a pattern with a high resolution. In order to meet the miniaturization demand of a mask pattern, pitch and sizes of the final ribs 354 and 354' may be reduced. However, when the sizes of the final ribs 354 and 354' are reduced, during a manufacturing process of the mask 340, the widths in the first direction I of the bottoms 354b and 354'b of the final ribs 354 and 354' could be less than a designed or desired value or could not be formed at all. Additionally, it may be difficult to control the curvature of the curved sides 354d and 354'd of the final ribs 354 and 354'. Moreover, when the widths in the first direction I of the bottoms 354b and 354'b of the final ribs 354 and 354' are formed at a designed or desired value, heights W1 in the third direction III of the inlet parts 352a may become less than a designed or desired value. For example, in one type of mask manufacturing method, in terms of tradeoff between the widths in the first direction I of the final ribs 354 and 354' and the heights W1 in the third direction III of the inlet parts 352a, when one is formed at a design or desired value, the other could be formed less than a design value. This may cause defective patterns of a deposition thin film.

The embodiments may provide a method of manufacturing a mask, which may be used for forming the desired sizes of the widths in the first direction I of the bottoms 354b and 354'b, the curvatures of the curved sides 354d and 354'd, and the heights W1 in the third direction III of the inlet parts 352a. Hereinafter, a mask manufacturing method according to embodiments will be described in more detail.

FIGS. 4A to 4H illustrate views of stages in a mask manufacturing method according to an embodiment.

Figure 4A:
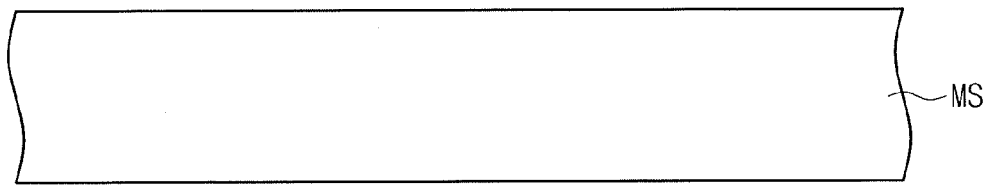
FIGS. 4A to 4H illustrate views of stages in a method of manufacturing a mask according to an embodiment.
Figure 4B:
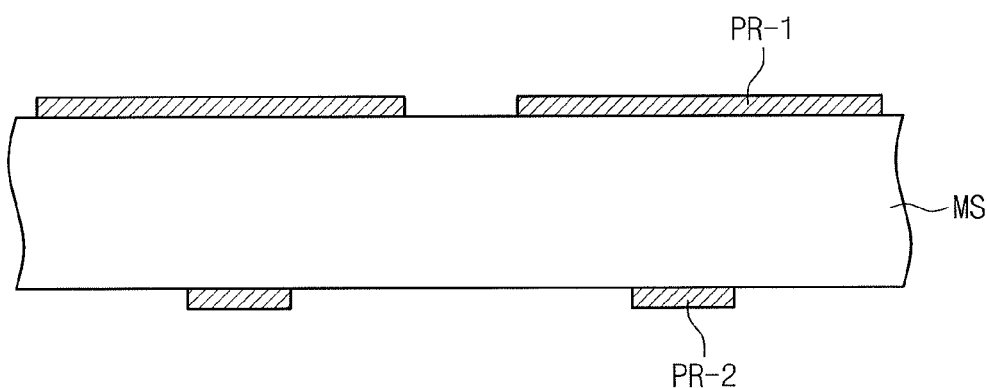
Figure 4C:
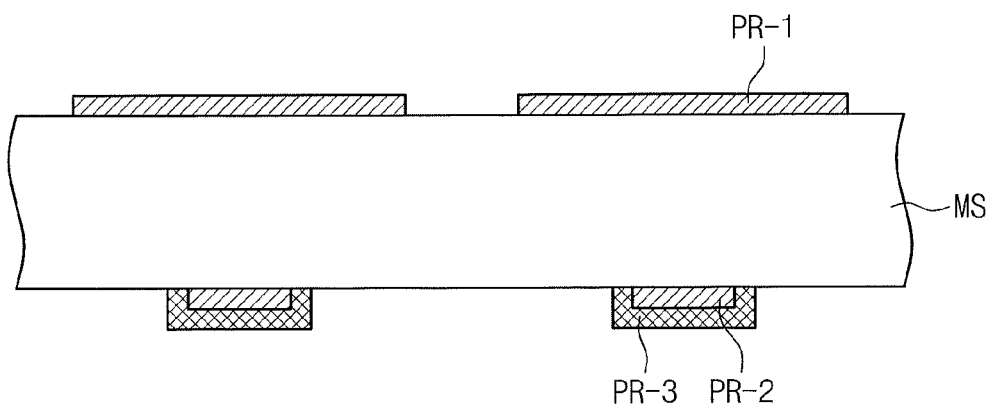
Figure 4D:
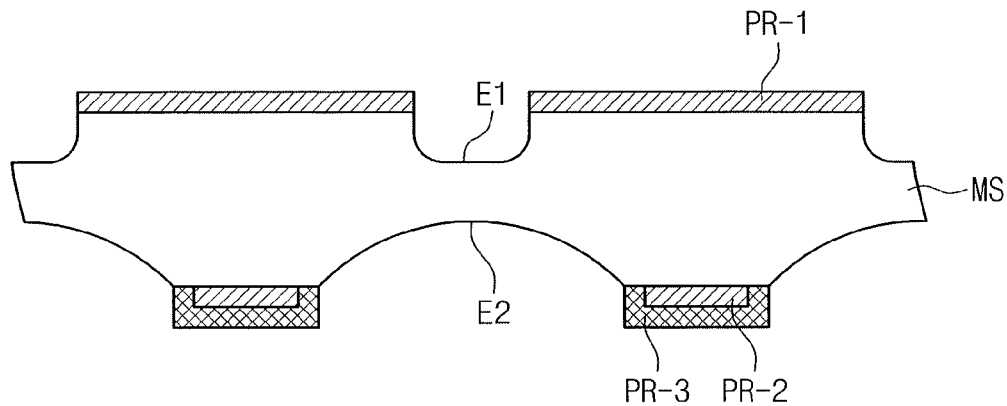
Figure 4E:
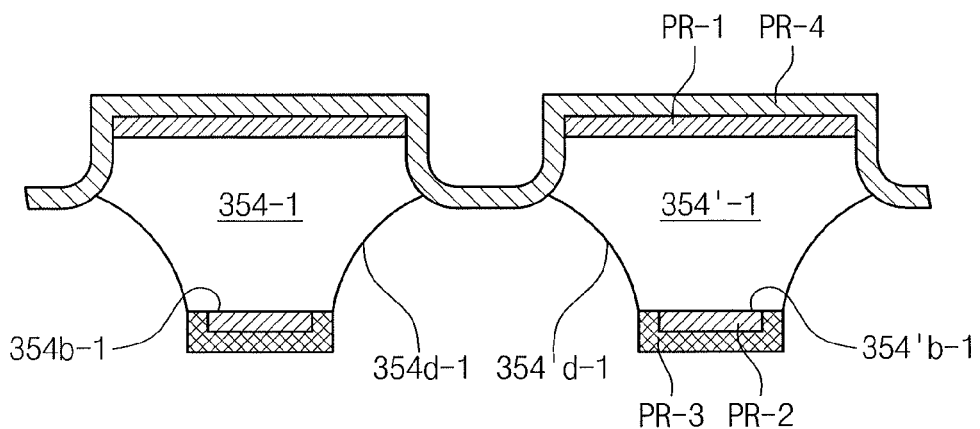
Figure 4F:
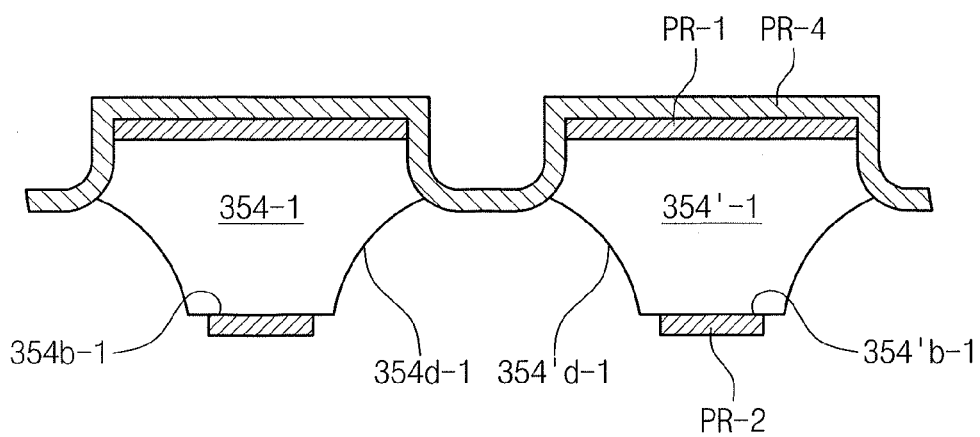
Figure 4G:
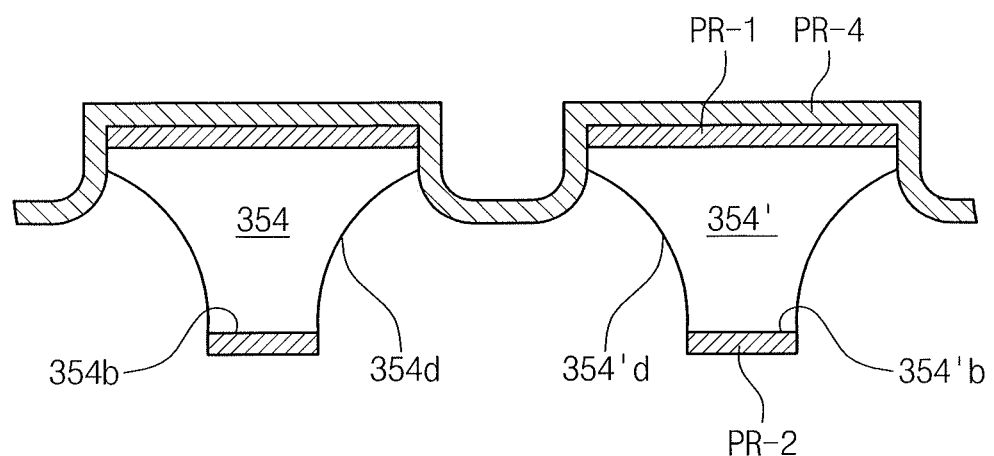
Figure 4H:
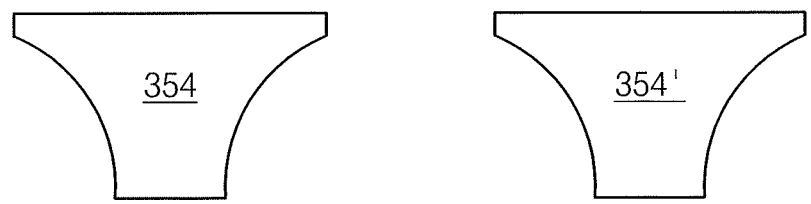

Referring to FIGS. 3, and 4A to 4H, the mask manufacturing method may include forming initial ribs that have larger bottom widths than the final ribs 354 and 354' (refer to FIGS. 4A to 4E), e.g., forming the final ribs 354 and 354' having smaller bottom widths than the initial ribs by removing end parts of the bottom of the initial ribs (refer to FIGS. 4F to 4H). The forming of the initial ribs (refer to FIGS. 4A to 4E) and the forming of the final ribs 354 and 354' (refer to FIGS. 4F to 4H) may be performed through a photolithography process.

First, referring to FIG. 4A, in order to form the initial ribs, a mask substrate MS (in which a slit pattern is to be formed) may be provided. The mask substrate MS may be a metal plate formed of one material of, e.g., SUS, Invar, nickel, cobalt, or alloys thereof.

Referring to FIG. 4B, a first photoresist pattern PR-1 may be formed on a top of the mask substrate MS. The first photoresist pattern PR-1 may have a width corresponding to the width of the tops 354a and 354'a of the final ribs 354 and 354'. An interval of the first photoresist pattern PR-1 may correspond to the width of the outlet part 352b. A second photoresist pattern PR-2 may be formed at a bottom of the mask substrate MS to face the first photoresist pattern PR-1 (e.g., with the mask substrate MS therebetween), and may be axis-aligned to a center of the first photoresist pattern PR-1. The second photoresist pattern PR-2 may have a width corresponding to the width of the bottoms 354b and 354'b of the final ribs 354 and 354'. An interval of the second photoresist pattern PR-2 may correspond to a lowermost width of the inlet part 352a.

Referring to FIG. 4C, a third photoresist pattern PR-3 may be formed at the bottom of the mask substrate MS to completely cover the second photoresist pattern PR-2. The third photoresist pattern PR-3 may be axis-aligned to the center of the second photoresist pattern PR-2. A width of the third photoresist pattern PR-3 may be greater than that of the second photoresist pattern PR-2. An interval of the third photoresist pattern PR-3 may be less than the lowermost width of the inlet parts 352a.

Referring to FIG. 4D, a first etching part E1 may be formed on the top of the mask substrate MS by using the first photoresist pattern PR-1 as a protective layer or mask. In an implementation, an etching depth of the first etching part E1 may correspond to a length of linear sides 354c and 354'c of the final ribs 354 and 354'. In an implementation, an etching depth of the first etching part E1 may be greater than a length of linear sides 354c and 354'c of the final ribs 354 and 354'. A second etching part E2 may be formed on the bottom of the mask substrate MS by using the second photoresist pattern PR-2 and the third photoresist pattern PR-3 as a protective layer or mask. An etching depth of the second etching part E2 may be less than a height of the curved sides 354d and 354'd of the final ribs 354 and 354'. In an implementation, the first etching part E1 and the second etching part E2 may be formed through isotropic etching using wet etching.

Referring to FIG. 4E, a fourth photoresist pattern PR-4 may be formed on the first photoresist pattern PR-1 and the first etching part E1 at the top of the mask substrate MS.

An area of the mask substrate MS between the first etching part E1 and the second etching part E2 may be penetrated through etching by using the first to fourth photoresist patterns PR-1, PR-2, PR3, and PR-4 as a protective layer. By the through etching, initial ribs 354-1 and 354'-1 (having initial curved sides 354d-1 and 354'd-1) may be formed. The initial curved sides 354d-1 and 354'd-1 may have a smaller curvature radius than the final ribs 354 and 354'. Additionally, the bottoms 354b-1 and 354'b-1 of the initial ribs 354d-1 and 354'd-1 may have a wider width than the bottoms 354b and 354'b of the final ribs 354 and 354'. In an implementation, the through etching may be performed through isotropic etching using wet etching.

Processes (refer to FIGS. 4F to 4H) for forming the final ribs 354 and 354' from the initial ribs 354-1 and 354'-1 will be described.

Referring to FIG. 4F, the third photoresist pattern PR-3 may be removed. Thus, the ends of the bottoms 354b-1 and 354'b-1 of the initial ribs 354-1 and 354'-1 may be exposed.

Referring to FIG. 4G, the initial curved sides 354d-1 and 354'd-1 and ends of the bottoms 354b-1 and 354'b-1 of the initial ribs 354-1 and 354'-1 may be etched by using the first, second, and fourth photoresist patterns PR-1, PR-2, and PR-4 as a protective layer. Therefore, the linear sides 354c and 354'c and the curved sides 354d and 354'd of the final ribs 354 and 354' may be formed. In an implementation, the etching may be performed through isotropic etching using wet etching.

Referring to FIG. 4H, the final ribs 354 and 354' may be formed by removing the first, second, and fourth photoresist patterns PR-1, PR-2, and PR-4. The slit 352 may be formed by the final ribs 354 and 354'.

FIGS. 5A to 5I illustrate views of stages in a mask manufacturing method according to another embodiment.

Figure 5A:
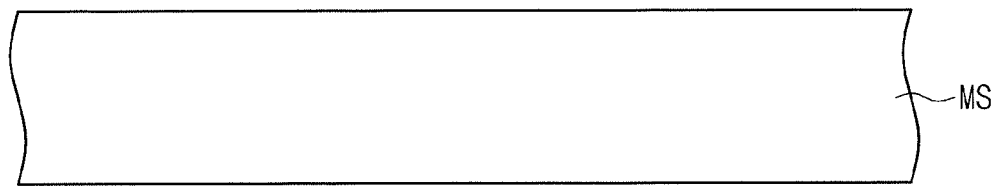
FIGS. 5A to 5I illustrate views of stages in a method of manufacturing a mask according to another embodiment.
Figure 5B:
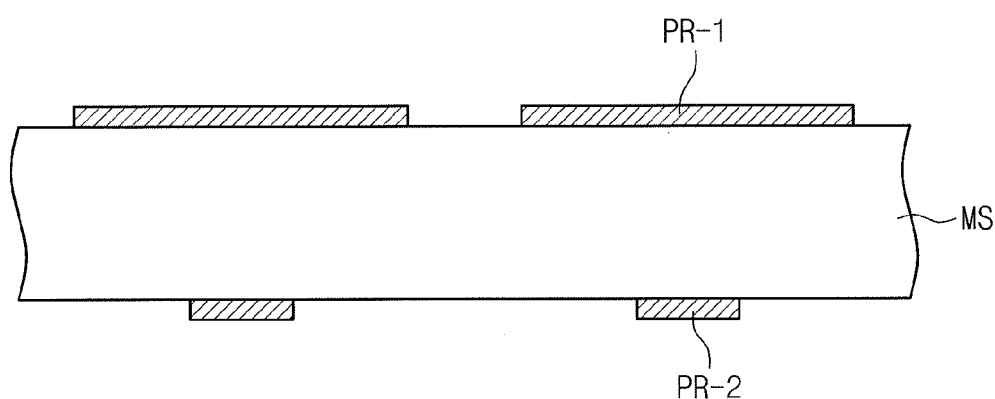
Figure 5C:
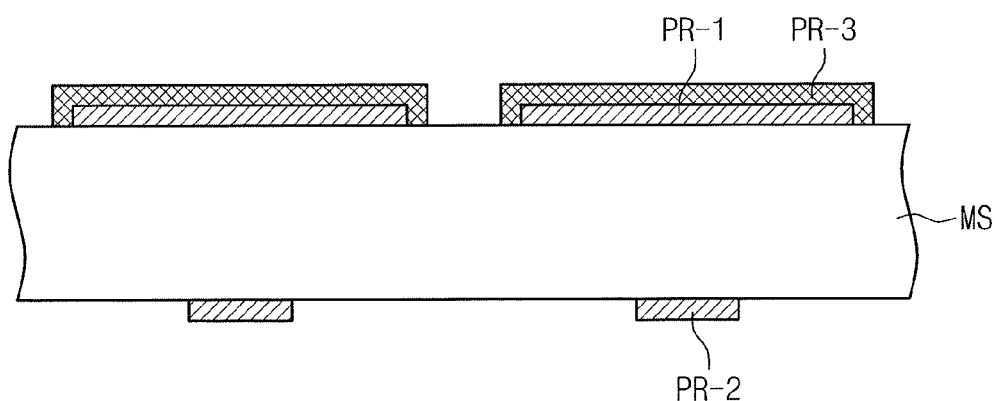
Figure 5D:
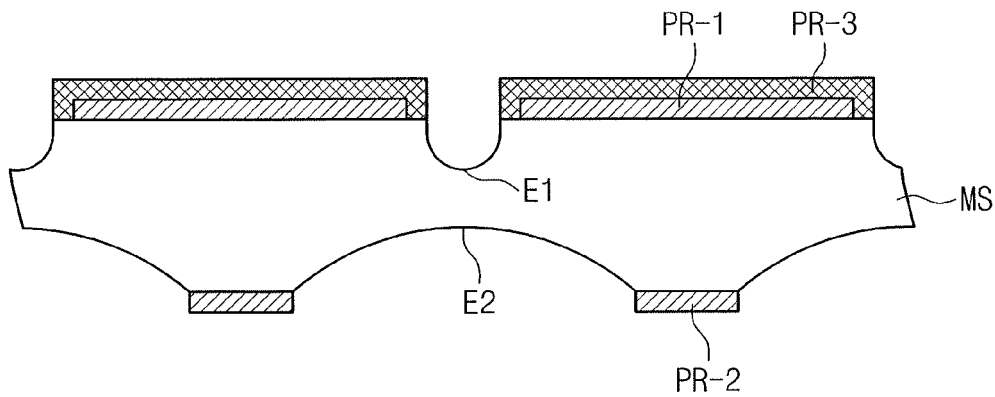
Figure 5E:
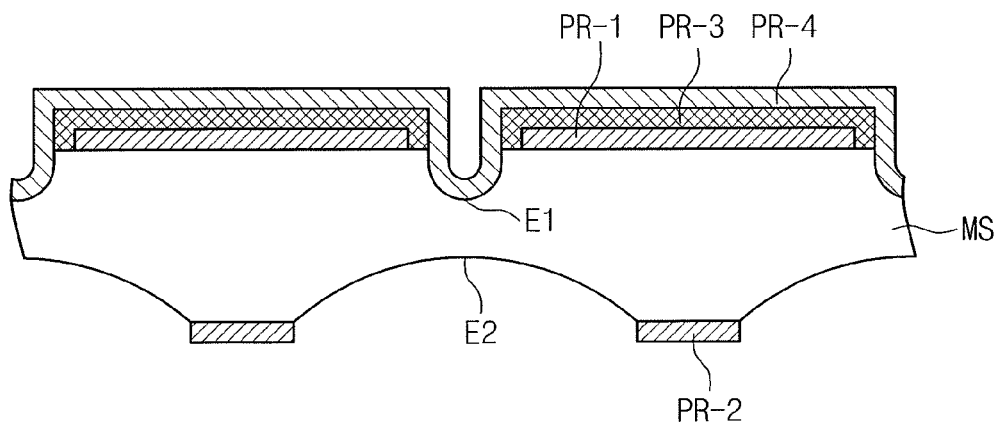
Figure 5F:
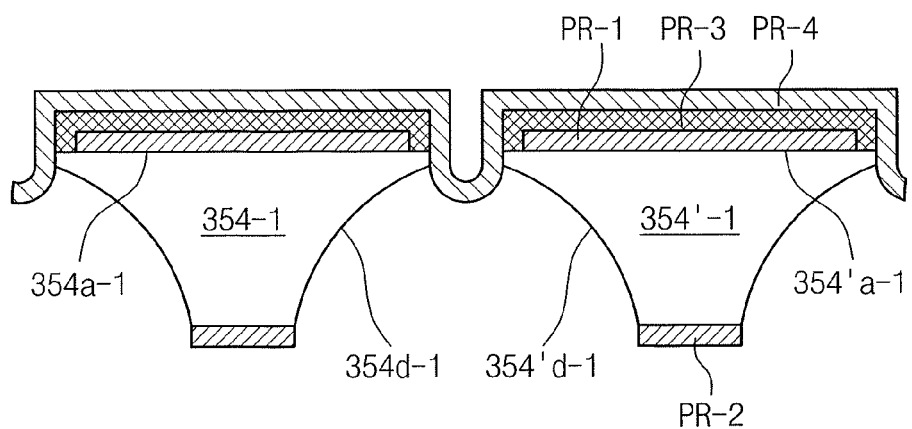
Figure 5G:
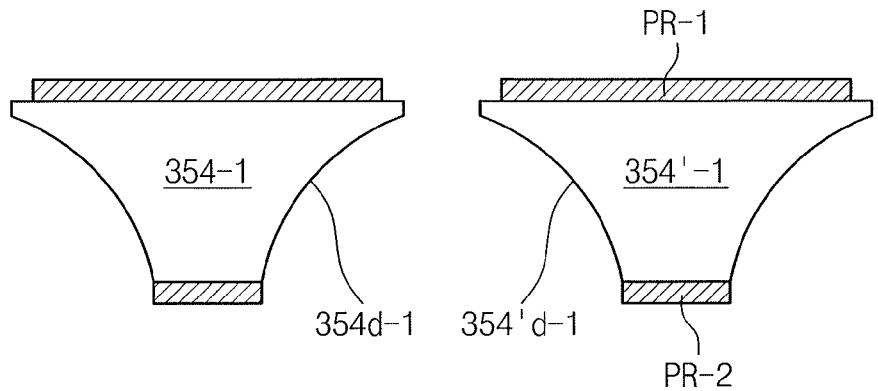
Figure 5H:
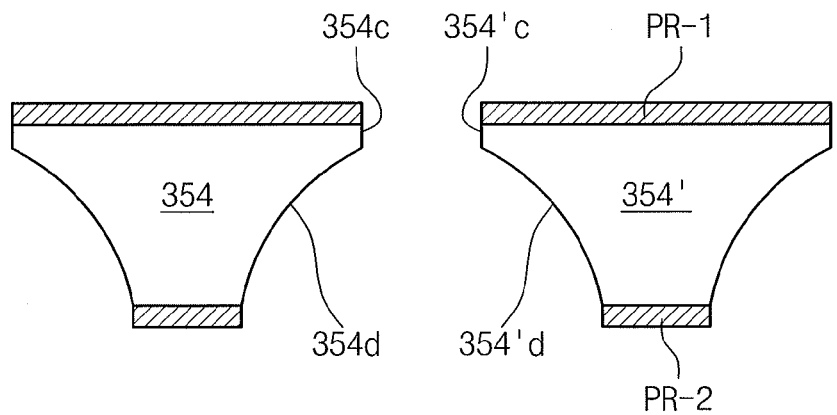
Figure 5I:
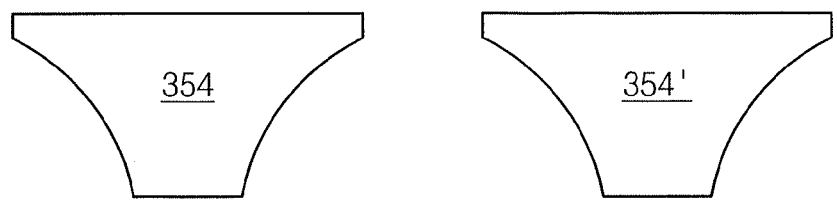

Referring to FIGS. 3, and 5A to 5I, the mask manufacturing method may include forming initial ribs having larger top widths than the final ribs 354 and 354' (refer to FIGS. 5A to 5F), e.g., forming the final ribs 354 and 354' having smaller top widths than the initial ribs by removing end parts of the top of the initial ribs (refer to FIGS. 5G to 5I). Forming the initial ribs (refer to FIGS. 5A to 5F) and forming the final ribs 354 and 354' (refer to FIGS. 5G to 5I) may be performed through a photolithography process.

First, referring to FIG. 5A, in order to form the initial ribs, a mask substrate MS (in which a slit pattern is to be formed) may be provided. The mask substrate MS may be a metal plate formed of one material of, e.g., SUS, Invar, nickel, cobalt, or alloys thereof.

Referring to FIG. 5B, a first photoresist pattern PR-1 may be formed on a top of the mask substrate MS. The first photoresist pattern PR-1 may have a width corresponding to the width of the tops 354$a$ and 354'$a$ of the final ribs 354 and 354'. An interval of the first photoresist pattern PR-1 may correspond to the width of the outlet part 352$b$. A second photoresist pattern PR-2 may be formed at a bottom of the mask substrate MS to face the first photoresist pattern PR-1 (e.g., with the mask substrate MS therebetween), and may be axis-aligned to a center of the first photoresist pattern PR-1. The second photoresist pattern PR-2 may have a width corresponding to the width of the bottoms 354$b$ and 354'$b$ of the final ribs 354 and 354'. An interval of the second photoresist pattern PR-2 may correspond to the lowermost width of the inlet part 352$a$.

Referring to FIG. 5C, a third photoresist pattern PR-3 may be formed at the top of the mask substrate MS to cover, e.g., completely cover, the first photoresist pattern PR-1. The third photoresist pattern PR-3 may be axis-aligned to the center of the first photoresist pattern PR-1. The width of the third photoresist pattern PR-3 may be greater than that of the first photoresist pattern PR-1. An interval of the third photoresist pattern PR-3 may be less than the width of the outlet parts 352$b$.

Referring to FIG. 5D, a first etching part E1 may be formed on the top of the mask substrate MS by using the first and third photoresist patterns PR-1 and PR-3 as a protective layer. In an implementation, an etching depth of the first etching part E1 may be less than the length of the linear sides 354$c$ and 354'$c$. In an implementation, an etching depth of the first etching part E1 may be greater than the length of the linear sides 354$c$ and 354'$c$. An etching part E2 may be formed on the bottom of the mask substrate MS by using the second photoresist pattern PR-2 as a protective layer. In an implementation, an etching depth of the second etching part E2 may be higher than the height of the curved sides 354$d$ and 354'$d$ of the final ribs 354 and 354'. In an implementation, an etching depth of the second etching part E2 may be shorter than the height of the curved sides 354$d$ and 354'$d$ of the final ribs 354 and 354'. In an implementation, the first etching part E1 and the second etching part E2 may be formed through isotropic etching using wet etching.

Referring to FIG. 5E, a fourth photoresist pattern PR-4 may be formed on the third photoresist pattern PR-3 on the mask substrate MS and the first etching part E1.

Referring to FIG. 5F, an area of the mask substrate MS between the first etching part E1 and the second etching part E2 may be penetrated through etching by using the first to fourth photoresist patterns PR-1, PR-2, PR3, and PR-4 as a protective layer. By the through etching, initial ribs 354-1 and 354'-1 (having initial curved sides 354$d$-1 and 354'$d$-1) may be formed. In an implementation, the initial curved sides 354$d$-1 and 354'$d$-1 may have a smaller curvature radius and a larger curve length than the curved sides 354$d$ and 354'$d$ of the final ribs 354 and 354'. In an implementation, the initial curved sides 354$d$-1 and 354'$d$-1 may have the same curvature radius and a larger curve length than the curved sides 354$d$ and 354'$d$ of the final ribs 354 and 354'. Additionally, the tops 354$a$-1 and 354'$a$-1 of the initial ribs 354$d$-1 and 354'$d$-1 may have a wider width than the tops 354$a$ and 354'$a$ of the final ribs 354 and 354'. In an implementation, the through etching may be performed through isotropic etching using wet etching.

Processes (refer to FIGS. 5G to 5I) for forming the final ribs 354 and 354' from the initial ribs 354-1 and 354'-1 will be described.

Referring to FIG. 5G the third and fourth photoresist patterns PR-3 and PR-4 may be removed. Therefore, sides of the tops 354$a$-1 and 354'$a$-1 of the initial ribs 354-1 and 354'-1 may be exposed.

Referring to FIG. 5H, the initial curved sides 354$d$-1 and 354'$d$-1 and the sides of the tops 354$a$-1 and 354'$a$-1 of the initial ribs 354-1 and 354'-1 may be etched by using the first and second photoresist patterns PR-1 and PR-2 as a protective layer. Therefore, the linear sides 354$c$ and 354'$c$ and the curved sides 354$d$ and 354'$d$ of the final ribs 354 and 354' may be formed. In an implementation, the etching may be performed through isotropic etching using wet etching.

Referring to FIG. 5I, the final ribs 354 and 354' may be formed by removing the first and second photoresist patterns PR-1 and PR-2. The slit 352 may be formed by the final ribs 354 and 354'.

As described above, a mask manufacturing method according to embodiments may include forming at least two photoresist patterns overlapping each other at one side of a mask substrate and then forming initial ribs through two or more etching processes. Then, the remaining photoresist patterns (except one formed first among the at least two photoresist patterns) may be removed and an etching process may be performed to form final ribs.

According to such a mask manufacturing method, although a pitch and size of the final rib may be reduced in order to deal with the miniaturization of a mask pattern, the width of the bottom of the final ribs, the curvature of the curved sides of the final ribs, and the height of the inlet parts may be formed at a desired size. Therefore, the deformation of a fine pattern of a mask may be minimized.

According to an embodiment, a mask of a high-accurate fine pattern may be provided.

Also, according to an embodiment, the deformation of a fine pattern of a mask may be minimized.

Moreover, according to an embodiment, in order meet a high integration required from a semiconductor device and a high resolution required from a flat panel display, a mask capable of transferring or depositing a pattern with a high resolution may be provided.

By way of summation and review, in order meet a high integration of a semiconductor device and a high resolution of a flat panel display, a deposition mask or a photo mask may be capable of depositing and transferring a pattern on a substrate with a high resolution.

The embodiments provide a method of manufacturing a deposition mask for a deposition process or a photo mask for an exposure process.

The embodiments may provide a method of manufacturing a mask of a highly-accurate fine pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a mask, the method comprising:
    forming initial ribs such that forming the initial ribs includes:
        forming at least two photoresist patterns such that the at least two photoresist patterns have different widths, are formed on at least one side of a mask substrate, and overlap each other, and
        performing an etching process at least two times; and
    forming final ribs such that the final ribs have curved sides having a different curvature radius than a curvature radius of initial curved sides of the initial ribs and have defined slit patterns, forming the final ribs including:
        removing all but one of the at least two photoresist patterns, and
        performing an etching process.

2. The method as claimed in claim 1, wherein forming the initial ribs and forming the final ribs each include performing a photolithography process.

3. The method as claimed in claim 2, wherein forming the initial ribs includes:
    forming a first photoresist pattern at a top of the mask substrate such that the first photoresist pattern has a width corresponding to a top width of the final ribs,
    forming a second photoresist pattern at a bottom of the mask substrate such that the second photoresist pattern has a width corresponding to a bottom width of the final ribs and faces the first photoresist pattern with the mask substrate therebetween,
    forming a third photoresist pattern on the second photoresist pattern such that the third photoresist pattern has a larger width than the second photoresist pattern and completely covers the second photoresist pattern,
    forming a first etching part at a top of the mask substrate by using the first photoresist pattern as a protective layer,
    forming a second etching part at a bottom of the mask substrate by using the second and third photoresist patterns as a protective layer,
    forming a fourth photoresist pattern on the first photoresist pattern and the first etching part, and
    forming the initial curved sides by through etching an area of the mask substrate between the first etching part and the second etching part using the first to fourth photoresist patterns as a protective layer.

4. The method as claimed in claim 3, wherein the initial curved sides have a smaller curvature radius than that of the curved sides.

5. The method as claimed in claim 3, wherein the third photoresist pattern has a width larger than a bottom width of the final ribs.

6. The method as claimed in claim 3, wherein a bottom of the initial ribs has a larger width than a bottom of the final ribs.

7. The method as claimed in claim 3, wherein an etching depth of the second etching part is less than a height of the curved sides of the final ribs.

8. The method as claimed in claim 3, wherein forming the final ribs includes:
    exposing side ends of a bottom of the initial ribs by removing the third photoresist pattern; and
    etching the side ends of the bottom of the initial ribs by using the first photoresist pattern, the second photoresist pattern, and the fourth photoresist pattern as a protective layer.

9. The method as claimed in claim 2, wherein forming the initial ribs includes:
    forming a first photoresist pattern at a top of the mask substrate such that the first photoresist pattern has a width corresponding to a top width of the final ribs,
    forming a second photoresist pattern at a bottom of the mask substrate such that the second photoresist pattern has a width corresponding to a bottom width of the final ribs and facing the first photoresist pattern with the mask substrate therebetween,
    forming a third photoresist pattern on the first photoresist pattern such that the third photoresist pattern has a larger width than the first photoresist pattern to completely cover the first photoresist pattern,
    forming a first etching part at a top of the mask substrate by using the first photoresist pattern and the third photoresist pattern as a protective layer,
    forming a second etching part at a bottom of the mask substrate by using the second photoresist pattern as a protective layer,
    forming a fourth photoresist pattern on the third photoresist pattern and the first etching part, and
    forming the initial curved sides by through etching an area of the mask substrate between the first etching part and the second etching part using the first to fourth photoresist patterns as a protective layer.

10. The method as claimed in claim 9, wherein the initial curved sides have a smaller curvature radius than that of the curved sides.

11. The method as claimed in claim 9, wherein the third photoresist pattern has a width larger than a top width of the final ribs.

12. The method as claimed in claim 9, wherein the top width of the final ribs is less than a top width of the initial ribs.

13. The method as claimed in claim 9, wherein an etching depth of the second etching part is less than a height of the curved sides of the final ribs.

14. The method as claimed in claim 9, wherein forming the final ribs includes:
    exposing side ends of a top of the initial ribs by removing the third photoresist pattern and the fourth photoresist pattern; and
    etching the side ends of the top of the ribs by using the first photoresist pattern and the second photoresist pattern as a protective layer.

15. The method as claimed in claim 1, wherein the etching process includes an isotropic etching process using wet etching.

16. The method as claimed in claim 1, wherein:
    each of the final ribs defining the slit pattern has a top width that is larger than a bottom width thereof and has a symmetrical trapezoidal cross-section; and
    a side of the cross-section has:
        a linear side vertically extending in a downward direction from an end part of the top, and
        the curved side concavely extending from an end part of the linear side to an end part of the bottom.

17. The method as claimed in claim 1, wherein the mask is:
    a deposition mask for a deposition process of a flat panel display or semiconductor device, or
    a photo mask used for a photolithography process of a flat panel display or semiconductor device.

* * * * *